United States Patent [19]

Mintz

[11] Patent Number: 5,391,275
[45] Date of Patent: Feb. 21, 1995

[54] METHOD FOR PREPARING A SHIELD TO REDUCE PARTICLES IN A PHYSICAL VAPOR DEPOSITION CHAMBER

[75] Inventor: Donald M. Mintz, Sunnyvale, Calif.

[73] Assignee: Applied Materials, Inc., Santa Clara, Calif.

[21] Appl. No.: 928,566

[22] Filed: Aug. 11, 1992

Related U.S. Application Data

[63] Continuation-in-part of Ser. No. 895,209, Jun. 8, 1992, Pat. No. 5,202,008, which is a continuation of Ser. No. 715,883, Jun. 17, 1991, abandoned, which is a continuation of Ser. No. 487,567, Mar. 2, 1990, abandoned.

[51] Int. Cl.$^6$ .......................... C23C 14/34; B44C 1/22; B24B 1/00
[52] U.S. Cl. .............................. 204/192.32; 156/643; 204/192.35; 204/298.11; 134/1; 451/38
[58] Field of Search ................... 51/319, 320; 156/345, 156/643, 646; 204/192.32, 192.33, 192.34, 192.35, 298.06, 298.11, 298.31, 298.34, 298.37

[56] References Cited

U.S. PATENT DOCUMENTS

| | | | |
|---|---|---|---|
| 3,649,502 | 3/1972 | Herte et al. | 204/192 |
| 3,699,034 | 10/1972 | Lins et al. | 204/192 |
| 3,773,639 | 11/1973 | Masotti | 204/192 |
| 3,864,239 | 2/1975 | Fletcher et al. | 204/192 |
| 4,368,092 | 1/1983 | Steinberg et al. | 156/345 |
| 4,392,932 | 7/1983 | Hara | 204/192 |
| 4,521,287 | 6/1985 | Kisner | 204/192.15 |
| 4,591,418 | 5/1986 | Snyder | 204/192.16 |
| 4,699,689 | 10/1987 | Bersin | 156/643 |
| 5,202,008 | 4/1993 | Talieh et al. | 204/298.11 X |

FOREIGN PATENT DOCUMENTS

| | | | |
|---|---|---|---|
| 2088659 | 4/1970 | France . | |
| 2147265 | 6/1972 | France . | |
| 60-248876A | 5/1984 | Japan | C23C 14/22 |
| 63-162861 | 12/1986 | Japan | C23C 14/34 |
| 63307271A | 6/1987 | Japan | C23C 14/38 |

OTHER PUBLICATIONS

Vossen et al., "Thin Film Film Processes", Academic Press, 1978, pp. 41–45 and pp. 253–255.
European Search Report, Patent Application 91102324.0, Jul. 17, 1991.

Primary Examiner—Nam Nguyen
Attorney, Agent, or Firm—Birgit E. Morris

[57] ABSTRACT

In a method for preparing a shield and/or clamping ring prior to use in a physical vapor deposition process, the shield and/or clamping ring is first bead blasted using an abrasive powder, then is treated in an ultrasonic cleaning chamber to remove loose particles and then sputter etched or treated with a plasma. The sputtering or plasma treatment serves to loosen contamination which may form a diffusion barrier and prevent the deposits from bonding to the shield and also serves to roughen the surface of the shield and/or clamping ring, to reduce interface voids and improve adhesion of sputtered material onto the shield and/or clamping ring. The process of the invention results in improved cleaning of the shield and/or clamping ring and improved adhesion of sputtered material thereon, thereby increasing the time before the shield/clamping ring must be cleaned and reducing down-time of the physical vapor deposition chamber.

17 Claims, 7 Drawing Sheets

METHOD FOR PREPARING A SHIELD TO REDUCE PARTICLES IN A PHYSICAL VAPOR DEPOSITION CHAMBER

This application is a continuation-in-part of U.S. application Ser. No. 07/895,209, filed Jun. 8, 1992, now U.S. Pat. No. 5,202,008, issued Apr. 13, 1993, which is a continuation of U.S. application Ser. No. 07/715,883, of U.S. application Ser. No. 07/487,567, filed Mar. 2, 1990, abandoned.

BACKGROUND OF THE INVENTION

The present invention concerns the preparation of shields and/or clamping rings in a physical vapor deposition chamber in order to increase shield adhesion and thereby achieve particle reduction in the chamber.

In physical vapor deposition (PVD) processes a target material, for example titanium tungsten, is bombarded by gaseous ions, for example argon ions. Material from the target is dislodged and sputters onto a workpiece. The workpiece is generally a semiconductor wafer, but may be, for example, a magnetic disk or a flat panel display.

A PVD chamber generally includes shields in the area immediately around a workpiece. The shields reduce the deposit of excess material sputtered from the target from contaminating the remainder of the PVD chamber. In addition, a clamping ring for the workpiece may also be present. Excess sputtered material will also deposit on the clamping ring.

For many types of sputtered materials, the build-up of excess material on the shields and/or clamping rings eventually results in flaking of the excess deposited material, producing particles in the chamber. At this point it is usually necessary to service the PVD chamber by replacing the shield and/or clamping ring. If shield or clamping ring replacement needs to be done at approximately the same time as target replacement, the servicing of the shield or clamping ring may be performed without loss of operation time. However, if the shield needs to be replaced much more often than the target, this can result in extra down time of the system which can seriously impair production throughput. It is desirable, therefore, to seek ways to reduce flaking and thereby lengthen the time between shield replacements.

SUMMARY OF THE INVENTION

In accordance with the invention, a method is disclosed for preparing a shield and/or clamping ring prior to use in a physical vapor deposition chamber. The shield and/or clamping ring is bead blasted, treated with ultrasonic cleaning, and finally sputter etched or plasma cleaned.

This process first treats the surface with bead blasting to create a specially roughened surface, then removes all embedded bead blast residue using the ultrasonic cleaning step, and then further treats the surfaces to remove oxide coatings that may form a diffusion barrier on the surface of the shield, thereby increasing adhesion of material deposited during processing of a workpiece in the PVD chamber.

DETAILED DESCRIPTION OF THE INVENTION

The bead blasting step makes the surface of the shield and/or clamping ring irregular. This enhances interface crack propagation of deposited material on a submicroscopic scale and hinders the flaking of deposited material. The surface irregularities force a fracture propagating along a plane of weakness to change direction or pass through a stronger region.

Secondly, the shield and/or clamping ring is subjected to an ultrasonic cleaning step to remove any loose particles on the surface after the bead blasting step.

Lastly, the shield and/or clamping ring is subjected to a sputter etch or plasma processing to further aid in removal of surface oxides and further roughen the surface to increase the surface area and to improve adhesion of material deposited onto the shield during PVD processing.

Figure 1:
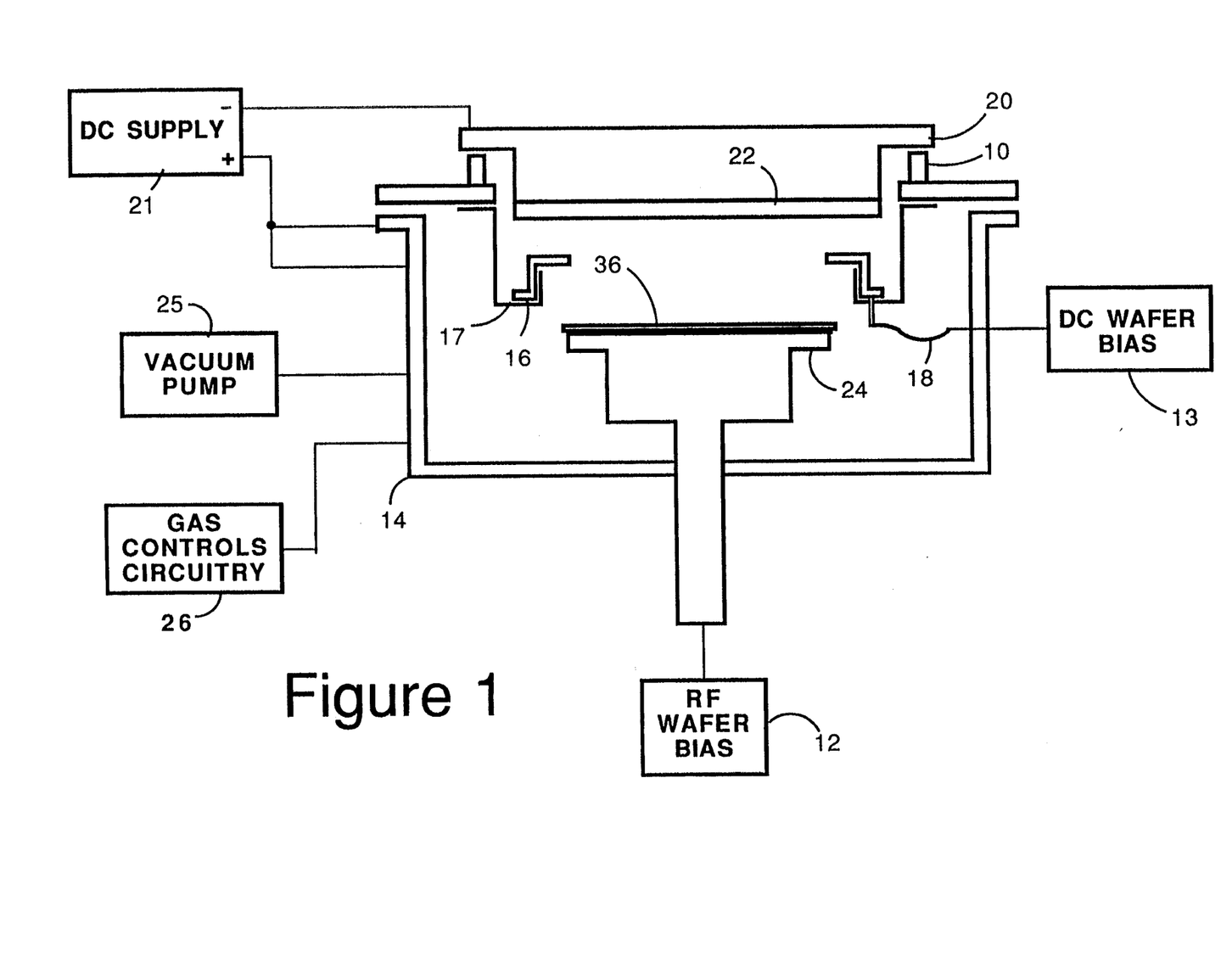
FIG. 1 is a simplified block diagram showing a physical vapor deposition chamber used for a sputter deposition process.

In FIG. 1, a PVD chamber 14 includes a movable workpiece table 24. During the course of processing a workpiece 36, such as a semiconductor wafer, is placed on the workpiece table 24. The workpiece table 24 is raised through a clamping ring 16 and a shield 17 to a processing location. An RF workpiece bias circuit 12 provides an RF bias voltage to the workpiece 36. A DC workpiece bias circuit 13 provides a DC bias to the workpiece 36 through a line 18.

Gas control circuitry 26 controls gas flow in and out of chamber 14. A vacuum pump 25 is used to create a vacuum in the PVD chamber 14 during processing of workpieces 36.

A source 20 has a sputter target 22 mounted thereon, which for example can be comprised of titanium-tungsten alloy. The source 20 is electrically isolated from the shield 17 and the clamping ring 16 and the rest of the PVD chamber 14 by an insulator ring 10. A DC power supply 21 establishes a voltage potential between the shield 17 and the source 20. When workpieces are being processed, the negative terminal of the DC power supply 21 is connected to the target 22. The positive terminal is grounded to the PVD chamber 14. This operating mode is used because gaseous ions from the plasma will be accelerated toward whatever surface is connected to the negative terminal of the power supply 21. Thus ions in the deposition plasma strike the target 22 and cause sputtering of the titanium-tungsten or other alloy onto the workpiece 36 on the workpiece table 24.

Figure 2:
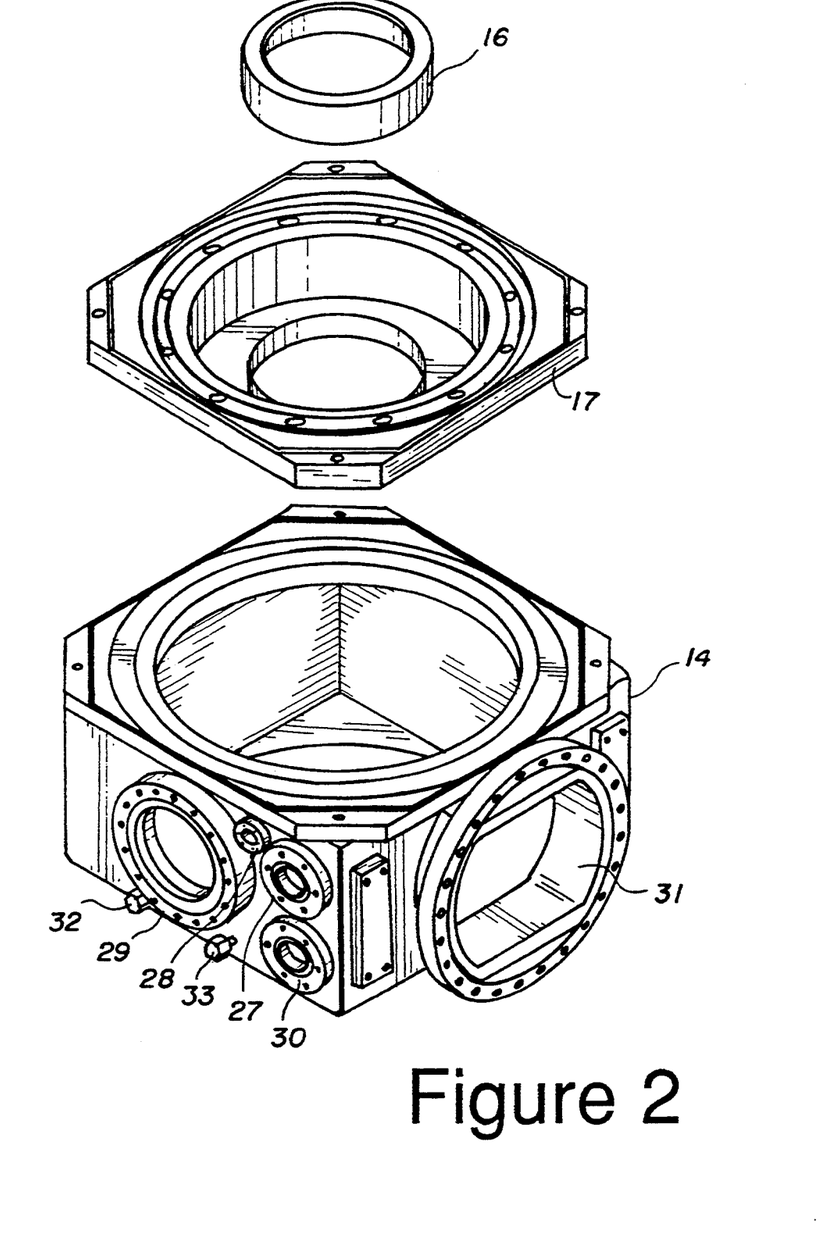
FIG. 2 shows a perspective view of a disassembled physical vapor deposition chamber in accordance with the preferred embodiment of the present invention.

FIG. 2 shows a PVD chamber 14, a shield 17 and a clamping ring 16. The chamber 14 is shown to include ports 27, 28, 29, 30, 31, 32 and 33. The port 30 may be used, for example, by the vacuum pump 25 or a roughing pump for initial pumping to create a vacuum in the chamber 14. The port 27 may be used, for example, by a residual gas analyzer. The port 28 may be used, for example, to allow a power line into the PVD chamber 14, to power a lamp used in the PVD process. The port 33 may be used, for example, for venting the chamber. The port 29 may be used, for example, as a window. The port 32 may be used, for example for supplying argon gas and any reactive gas into the chamber 14. Workpieces are placed in the PVD chamber 14 through an opening 31 by automated machinery (not shown).

During sputter deposition onto a workpiece, excess target material is deposited on the shield 17 and the clamping ring 16. This material builds up and eventually begins to flake. The flaking results in unwanted particles contaminating the PVD chamber 14. The present invention pertains to preparing the surface of the shield 17 and clamping ring 16 to increase adhesion of such excess material to these surfaces.

The adhesion strength of the target material on the shield and clamping ring depends on both the bonding strength between the target material and the material of which the shield and clamping ring are made, and it depends on the microstructure of the interface region between the target material and the shield 17 and/or the clamping ring 16.

For increased adhesion, before the sputter-etch cleaning of the shield 17 and the clamping ring 16, the shield may be bead blasted. The bead blasting is done by bombarding the shield 17 and the clamping ring 16 with aluminum oxide abrasive powder. The bead blasting may be done in a commercially available sand blasting chamber.

The bead blasting makes the surface of the shield 17 and the clamping ring 16 irregular. The irregular surface, on a microscopic scale, will enhance interface crack propagation of material such as TiW which is later deposited on the shield 17 and the clamping ring 16. Thus the surface irregularities will result in the breaking up of the deposited films into sections that are small with respect to flake sizes. This significantly hinders flaking.

Prior art treatments after a bead blasting step have been found to be completely inadequate. According to one method, the bead blasted part is dipped into dilute hydrofluoric acid (HF). This solution is capable of dissolving bead-blasted media composed of glass shot for example, but cannot dissolve aluminum oxide during the typical processing time, i.e., up to a few minutes. In addition, this process attacks the surface of the shield/clamping ring parts being processed, and, depending on the material of the part, may even reduce surface roughness.

According to a second method, the bead blasted part is sprayed with high-pressure water to physically dislodge the bead blast medium. This process will remove various grades of aluminum oxide in addition to glass shot and other materials, but the full pressures required cannot be used for shield parts which are fabricated of sheet metal to very close tolerances. Full pressures can deform the precision machined parts, and lower pressures are inadequate to dislodge the bead blasting medium from their surfaces.

In accordance with the process of the present invention, the shield 17 and clamping ring 16 are next cleaned by ultrasonic cleaning to remove all loose particles from the surface, whether they are due to particles remaining after the bead blasting, loose oxide, dust and the like. The shield 17/clamping ring 16 are rinsed with deionized water and immersed in an ultrasonic cleaner filled with deionized water. Suitable ultrasonic cleaners are commercially available and are generally set to run at power densities of from about 35–70 Watts/gal using a chamber containing about 10 gallons of deionized water for several minutes. As soon as the ultrasonic generator is turned on, a cloud of formerly embedded solid residue is seen to form over bead blasted surfaces from which it originated. This cloud quickly dissipates and the solid material removed either remains in water suspension or settles out. Thus, most of the activity of ultrasonic processing occurs during the initial few seconds of treatment. Treatment is usually continued for several minutes however in order to assure thorough removal of all loose solid material.

The parts are then rinsed with deionized water and dried with filtered inert gas such as nitrogen.

To increase bonding strength, the shield 17 and/or clamping ring 16 is then treated in a vacuum chamber, and can be sputter etch cleaned, or cleaned in a reactive or non-reactive plasma. Preferably the shield and clamping ring parts are sputter etch cleaned before use. The sputter etch cleaning serves to loosen contamination which may form a diffusion barrier, such as oxides, and thereby prevent the target material from strongly bonding or adhering to the shield 17 and the clamping ring 16. Also, the sputter etch cleaning creates a high density of micro surface roughness. These defects allow for an increase in nucleation sites which minimize the formation of interface voids.

Figure 3:
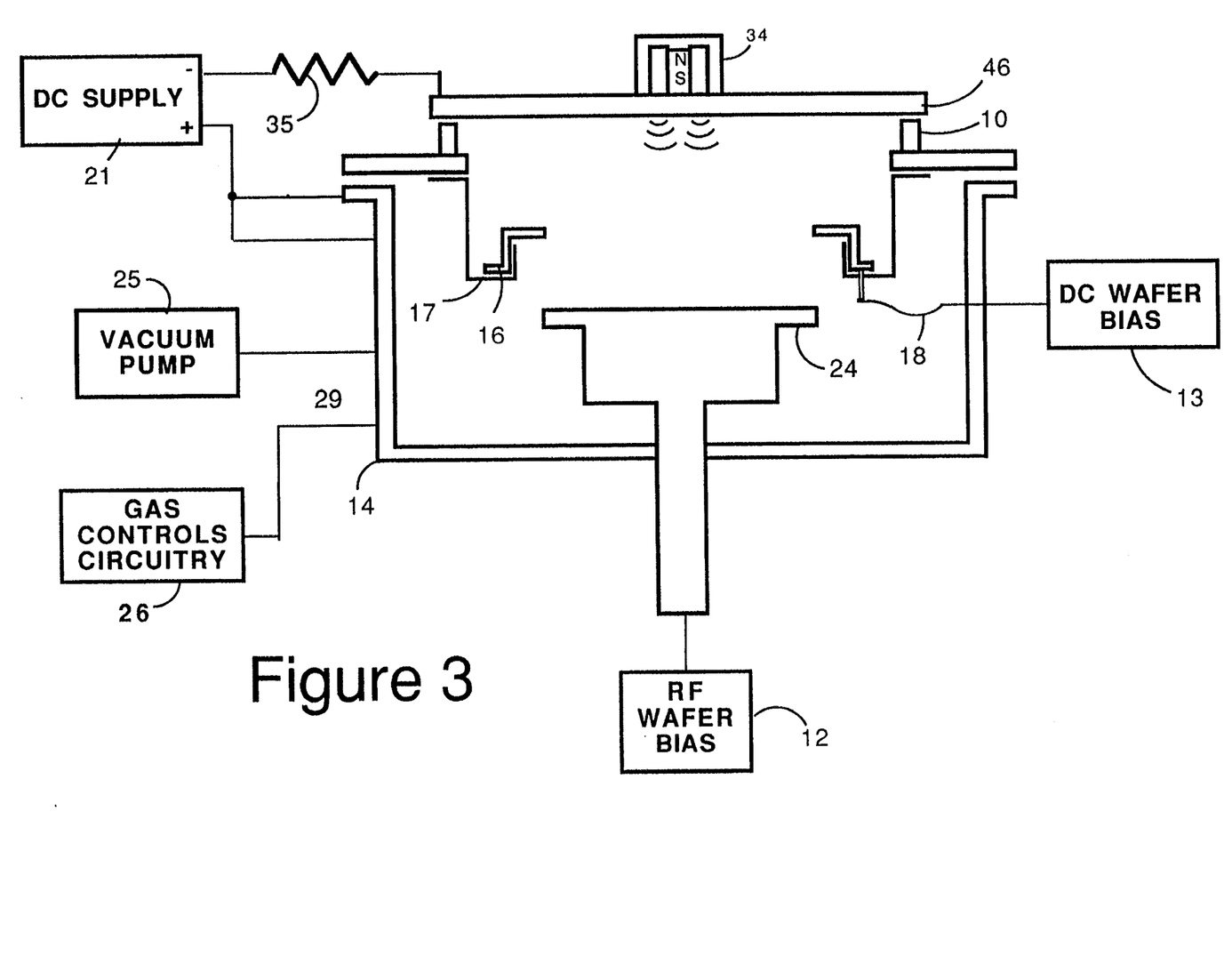
FIG. 3 shows a physical deposition chamber arranged to sputter-etch clean a shield in accordance with an alternate embodiment of the present invention.

In the preferred embodiment of the present invention, sputter etch cleaning of the shield and clamping ring is done in a chamber from which source 20 is removed. As seen in FIG. 3, the source 20 is replaced with a flat cover plate 46 fabricated of aluminum alloy, stainless steel or some other vacuum compatible metallic material. In the center of the cover plate 46 is mounted an arrangement of permanent magnets 34 which does not exceed half of the chamber lid size in diameter. During the etch process, the cover plate 46 is biased positive to a value between +300 volts and +1000 volts. The cover plate 46 thus becomes the anode of a glow discharge in the vacuum chamber. Power in the range of 40 Watts to 500 Watts is applied to the cover plate 46. The negative terminal of the power supply 21 is grounded to the PVD chamber 14, the shield 17 and the clamping ring 16. The preferred operating ambient is three to twelve millitorr (0.5–2 Pa) of argon.

The magnet assembly 34 is used to maintain plasma operation at the low operating pressures where the process is most efficient at etching the grounded shield 17 and the clamping ring 16. Alternate means of striking the shield etch plasma include momentary application of high pressure in the range of 50 millitorr to 500 millitorr (7–70 Pa) and include the momentary application of a high voltage AC or DC. Two types of power supplied may be used to maintain the plasma. The first is a constant power supply with a rating of 1000 volts and 1 kilowatt. The second is a 1000 volt constant-voltage power supply used in conjunction with a high power ballast resistor 35.

At discharge powers of 250 Watts, the shield 17 may typically be cleaned to a satisfactory degree after several minutes of the etch process.

Making the surface of the shield 17 and clamping ring 16 rough, both through bead blasting and plasma treatment, increases adhesion due to purely mechanical effects. The rough surface provides a greater surface area, and distributes stress, that is, when one side of a ridge is in tensile stress, the other side of the ridge is in compression stress.

The choice of material for the shield 17 and the clamping ring 16 is also important to maximize adhesion. Shields made of titanium, stainless steel covered with a film of aluminum, tungsten or molybdenum have proved to provide satisfactory adhesion.

Further, designing the shield 17 and the clamping ring 16 to maximize the surface on which excess TiW material, for example, is deposited, reduces the thickness of the deposits in a given amount of sputtering time as well.

Although the discussion of the preferred embodiment has focussed on increasing the adhesion of TiW to the shield 17, the invention is applicable to increasing adhesion of other materials used in PVD chambers. For instance, the inventive process may be used to increase adhesion from depositions of pure tungsten, or a reactive deposition of titanium nitride.

Figure 4:
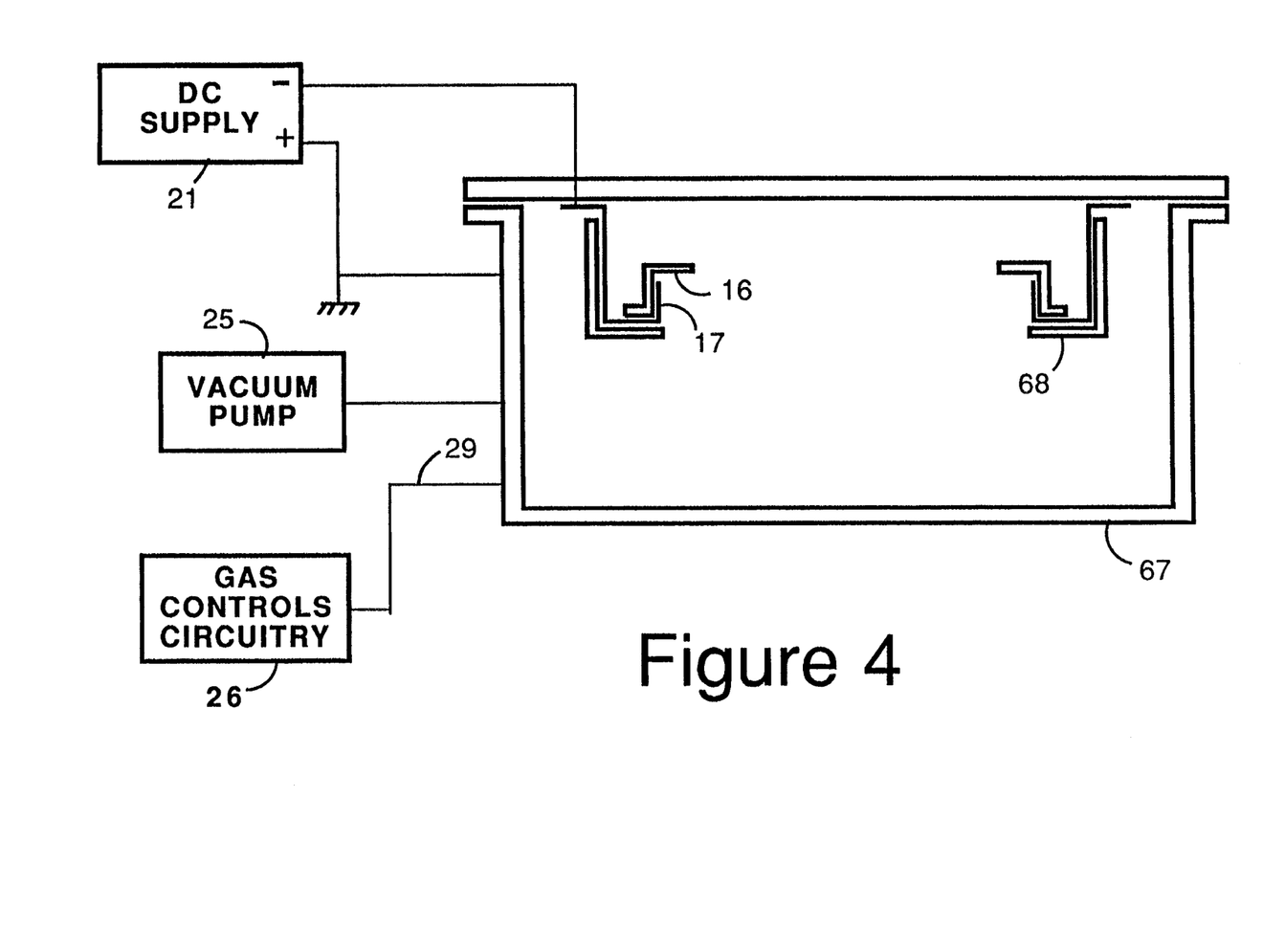
FIG. 4 is a block diagram of a system which uses a DC power supply to off-line etch a shield in preparation for use of the shield in a physical deposition chamber in accordance with an alternate embodiment of the present invention.

As an alternative to an in situ sputter etch cleaning in argon, described above, the shield 17 and clamping ring 16 can be cleaned outside of the PVD processing chamber 14 in a stand-alone chamber 67. This is illustrated in FIG. 4 where a shield 17 and a clamping ring 16 are shown resting on an insulating fixture 68 in a stand-alone chamber 67. In the sputter cleaning process, the shield 17 and clamping ring 16 are made the cathode of a sputter etch plasma. This can be done, for example, by connecting the negative terminal of the power supply 21 to the shield 17 and the clamping ring 16, and grounding the positive terminal of the power supply 21 to the stand-alone chamber 67. The power applied may be, for example, in the range of 50-500 Watts. The operating pressure may be for example in the range of 2-8 millitorr. In order to etch only the side of the shield 17 and the clamping ring 16 that receive sputter deposits during processing in the PVD chamber 14, portions of the shield 17 and the clamping ring 16 which will not receive sputter deposits are held against the insulating fixture 68.

Figure 5:
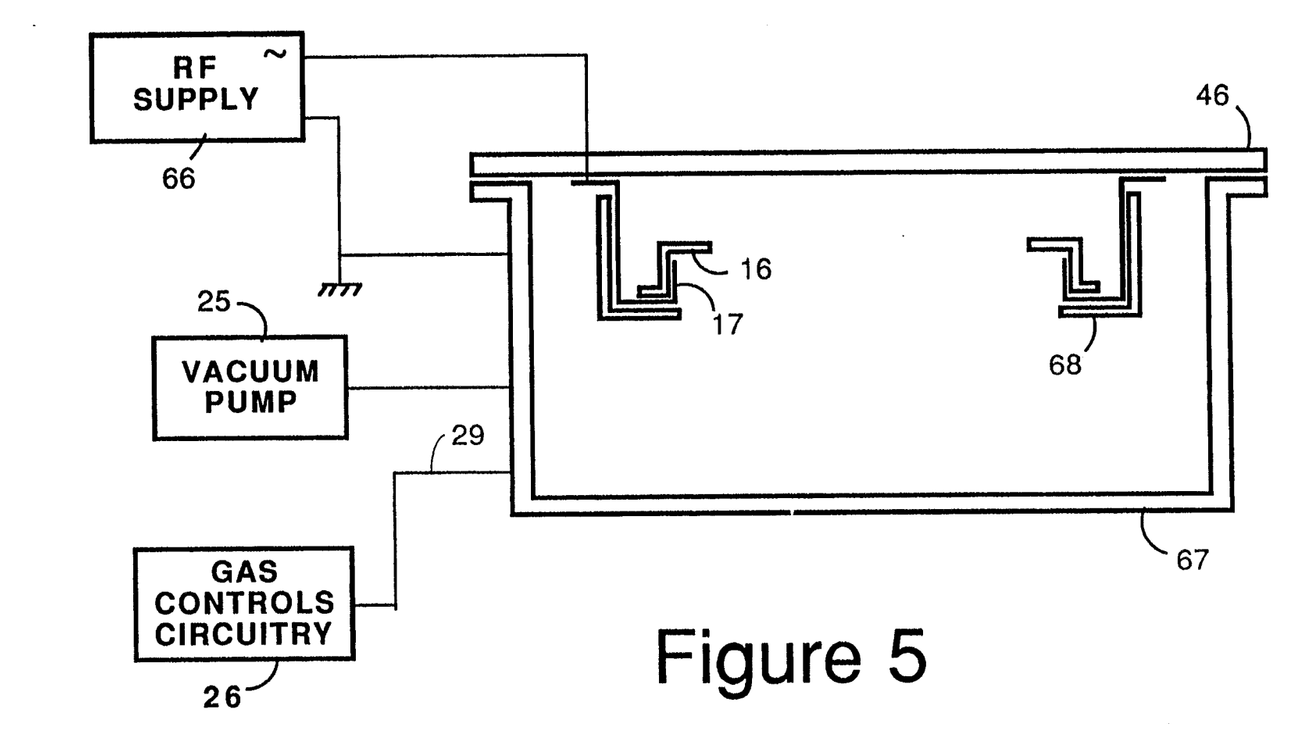
FIG. 5 is a block diagram of a system which uses an RF power supply to off-line etch a shield in preparation for use of the shield in a physical deposition chamber in accordance with an alternate embodiment of the present invention.

FIG. 5 shows the system of FIG. 4 modified so that an RF power signal is applied to the shield 17 and the clamping ring 16 by RF power supply 66. The frequency of the RF signal may be, for example, 13.56 Megahertz (MHz) or some other industrial, scientific or medical (ISM) frequency, for example 27.12 or 40.68 MHz. When the operating pressure is in the range of 2-8 millitorr, and the operating power is in the range of 50 to 500 Watts, adequate etching can be achieved in a few minutes.

As an alternative to sputter etch cleaning, the shield 17 and the clamping ring 16 can be cleaned by gentle bombardment of a plasma (i.e., plasma cleaning) below the threshold and under process conditions where no shield etch material is physically removed. For example, the surface of the shield 17 and clamping ring 16 can be reacted in an oxygen plasma to intentionally produce an oxide scale to which certain sputtered materials might readily adhere. Alternately, oxide scale on the shield 17 and clamping ring 16 can be removed without the evolution of sputtered metal atoms through the action of a hydrogen plasma. Such reactive processes could be performed in situ in PVD chamber 14, or can be performed off line in the stand-alone chamber 67.

Figure 6:
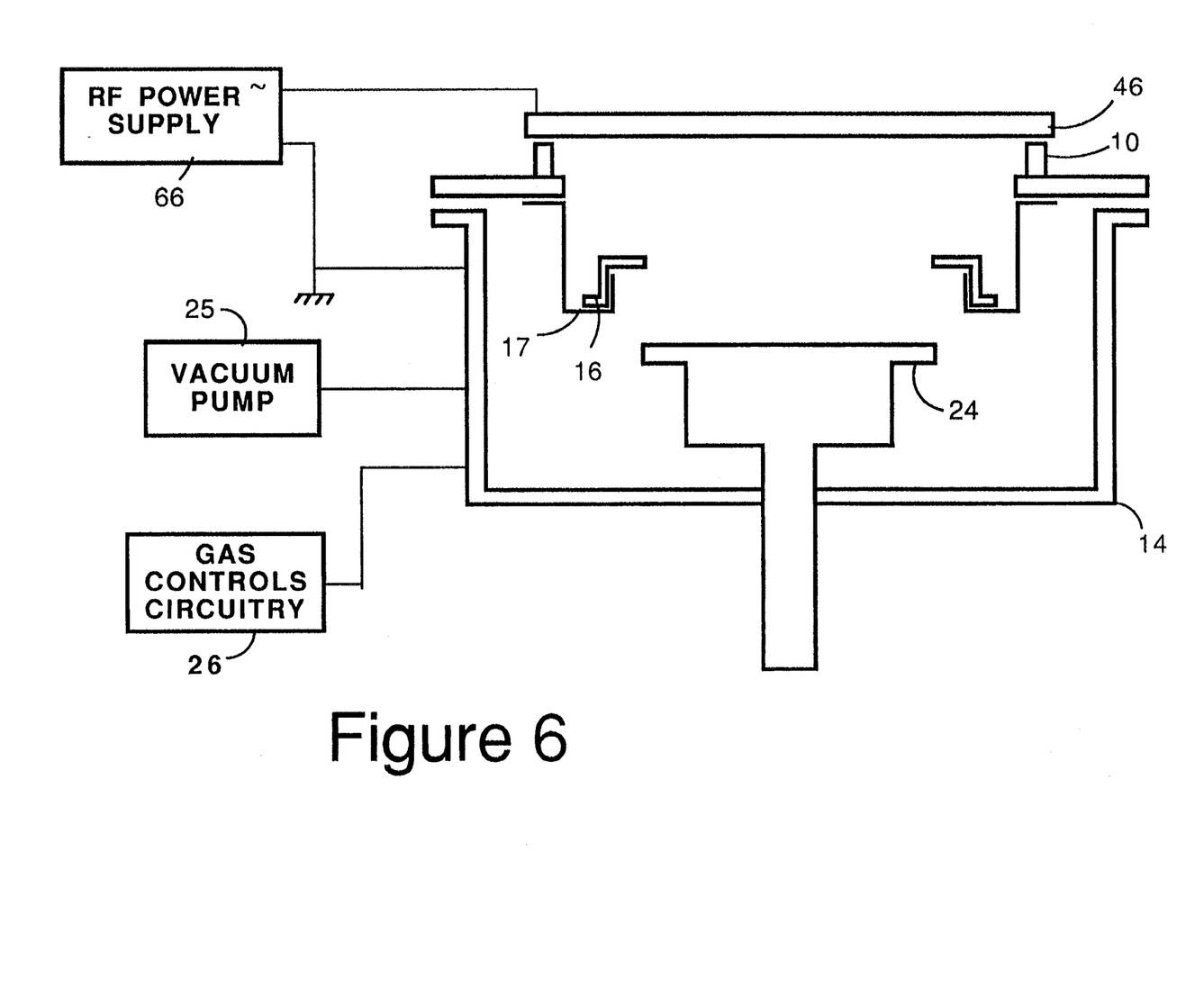
FIG. 6 shows a physical deposition chamber in which an RF power signal is placed on a lid for in situ reactive or non-reactive plasma treatment of a shield and a clamping ring in accordance with an alternate embodiment of the present invention.

In FIG. 6 the PVD chamber 14 is shown modified to facilitate plasma cleaning. An RF power signal at an ISM frequency (e.g., 13.56 MHz) is applied to the cover plate 46 of the PVD chamber 14 by RF power supply 66. Typically for plasma cleaning, the pressure inside the PVD chamber 14 is from 20 millitorr to about 2 torr, and the RF power signal generates power of about 50-200 Watts. At such an elevated pressure, collisions would retard sputter evolution of metal from the shield 17 and the clamping ring 16.

When plasma cleaning is done in a stand-alone chamber 67 as shown in FIG. 5, the pressure inside the stand-alone chamber 67 could be about 20 millitorr to about 2 Torr, and an RF power signal could generate power of 50 to about 200 Watts.

The clamping ring 16 and the shield 17 can also be cleaned using a non-reactive desorption cleaning process. For example the shield 17 and clamping ring 16 can be bombarded with argon at energies below the energy threshold at which sputtering will take place. Such a non-reactive desorption cleaning is useful to dislodge adsorbed water and residual liquid or solid contamination which might remain after wet cleaning the shield 17 and the clamping ring 16.

Non-reactive desorption cleaning may be performed in situ in the PVD chamber 14 when the PVD chamber is arranged as shown in FIG. 6. An RF power signal at an ISM frequency is applied to the cover plate 46 of the PVD chamber 14 by RF power supply 66. Inside the PVD chamber 14 is an inert gas ambient, such as argon. Other inert gases such as helium, neon or krypton can be substituted for argon. When the pressure inside the PVD chamber 14 is about 20 millitorr to 2 Torr, sufficient collisions would slow down plasma ions so that a high density could be built up with less than 10 electron-Volts of energy. The impact of the plasma ions on the shield 17 and the clamping ring 16 would desorb physisorbed species.

The non-reactive desorption cleaning may also be performed off line in the stand-alone chamber 67. An RF power signal at an ISM frequency is applied to the shield 17 and the clamping ring 16 by RF power supply 66. Inside the stand-alone chamber 67 is an inert gas ambient such as argon. When the pressure inside the stand-alone chamber 67 is about 20 millitorr to 2 Torr, and the RF power signal generates power of 50 to 500 Watts, sufficient collisions would slow down plasma ions such that a high density could be built up with less than 10 electron-Volts of energy. The impact of the plasma ions on the shield 17 and the clamping ring 16 would desorb physisorbed species. The use of insulating fixture 68 is optional as no metal is sputtered from the shield 17 or the clamping ring 16.

Plasma used in a reactive plasma process may be generated in a separate upstream plasma preparation chamber. One advantage of such a method is that an upstream plasma preparation chamber may be considerably smaller than the parts that are processed. Upstream activation of reactive plasma may be done whether the plasma etching is done in situ in a PVD chamber, or in a stand-alone chamber.

Figure 7:
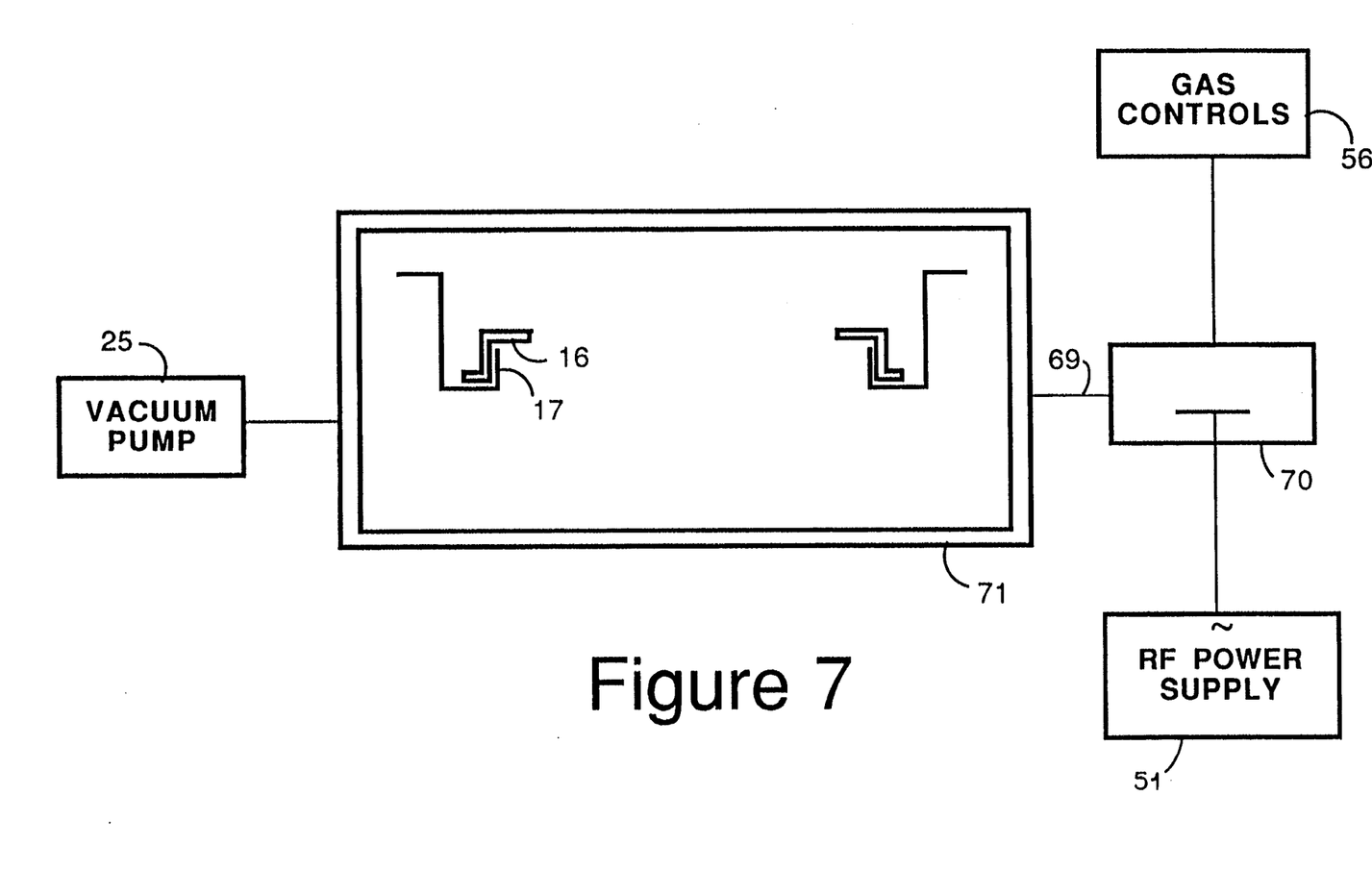
FIG. 7 is a block diagram of a system in which is performed off-line or in situ plasma treatment of a shield in preparation for use of the shield in a physical deposition chamber where the plasma is generated in a special upstream chamber in accordance with an alternate embodiment of the present invention.

FIG. 7 shows a shield 17 and a clamping ring 16 placed in a chamber 71. Plasma is activated in an upstream plasma preparation chamber 70 before being pumped through a port 69 to chamber 71. A power supply 51 supplies either a DC power signal or an RF power signal to the upstream plasma preparation chamber 70. Effluent, for example atomic hydrogen, atomic oxygen or atomic fluorine, or other fragments of gaseous precursors therefor, pass to the shield 17 and the clamping ring 16 in the chamber 71 through a connection 69. When the pressure within the upstream plasma preparation chamber 70 is in the range of about 10 millitorr to 1 Torr, and the power supply 51 supplies power in the range of about 50 to 500 Watts. the upstream plasma preparation chamber 70 is generally able to produce copious amounts of reactive atomic species.

About twice as many workpieces can be processed in a PVD chamber after treating the shield and/or clamping ring in accordance with the present process before having to service or substitute new ones as when the ultrasonic cleaning is omitted.

It will be apparent that various changes can be made to the above process without departing from the above teachings. For example, the shield 17 and the clamping ring 16 can be precleaned using a cleaning solution used to brighten titanium before the bead blasting step. In that case, chemical cleaning is followed by a deionized water rinse and drying of the parts. A filtered air stream can be used to remove loosely adhered particles from the surfaces or parts to be cleaned, or rinses with deionized water followed by a drying step can also be used or substituted between any of the above process steps, as will be known to one skilled in the art. The invention is only meant to be limited by the appended claims.

I claim:

1. A method of cleaning a shield and/or clamping ring prior to use in a physical vapor deposition chamber comprising:
   a) bead blasting the shield and/or clamping ring;
   b) ultrasonically cleaning the shield and/or clamping ring after step a); and
   c) sputter-etch cleaning the shield and/or clamping ring.

2. A method according to claim 1 wherein the bead blasting is done with aluminum oxide abrasive powder.

3. A method according to claim 1 wherein the shield comprises a material selected from a member of the group consisting of titanium, stainless steel, aluminum, molybdenum and aluminum coated stainless steel.

4. A method according to claim 1 wherein the sputter etch cleaning is done in a chamber in which power within the range of about 50 to 500 Watts is applied to an anode plate mounted in the chamber in place of a sputter source.

5. A method as in claim 4 wherein the power source is a DC power signal.

6. A method as in claim 4 wherein the power source is an RF power signal.

7. A method as in claim 1 wherein the sputter-etch cleaning is done off line in a stand-alone chamber.

8. A method for preparing a shield and/or clamping ring prior to use in a physical vapor deposition process comprising:
   a) bead blasting the shield and/or clamping ring;
   b) ultrasonically cleaning the shield and/or clamping ring after step a); and
   c) reactive plasma cleaning the shield and/or clamping ring.

9. A method according to claim 8 wherein the bead blasting is done with an aluminum oxide abrasive powder.

10. A method according to claim 8 wherein the plasma is activated in an upstream activation chamber.

11. A method according to claim 8 wherein the reactive plasma is made from oxygen.

12. A method according to claim 8 wherein the reactive plasma is made from hydrogen.

13. A method according to claim 8 wherein the shield and/or clamping ring comprises a material selected from the group consisting of titanium, stainless steel, molybdenum, aluminum and aluminum coated stainless steel.

14. A method for preparing a shield and/or clamping ring prior to use in a physical vapor deposition process comprising:
   a) bead blasting the shield and/or clamping ring;
   b) ultrasonically cleaning the shield and/or clamping ring after step a); and
   c) cleaning the shield and/or clamping ring using a non-reactive plasma.

15. A method according to claim 14 wherein the bead blasting is done with an aluminum oxide abrasive powder.

16. A method according to claim 14 wherein the plasma is generated from an inert gas ambient.

17. A method according to claim 16 wherein the inert gas is argon.

* * * * *